United States Patent [19]
Ajit

[11] Patent Number: 5,757,034
[45] Date of Patent: May 26, 1998

[54] EMITTER SWITCHED THYRISTOR

[75] Inventor: Janardhanan S. Ajit, Sunnyvale, Calif.

[73] Assignee: International Rectifier Corporation, El Segundo, Calif.

[21] Appl. No.: 768,242

[22] Filed: Dec. 17, 1996

Related U.S. Application Data

[63] Continuation-in-part of Ser. No. 516,824, Aug. 18, 1995, which is a continuation-in-part of Ser. No. 281,917, Jul. 28, 1994, Pat. No. 5,444,272.

[51] Int. Cl.$^6$ .................... H01L 29/74; H01L 31/111
[52] U.S. Cl. ................. 257/133; 257/132; 257/137; 257/146; 257/378
[58] Field of Search ........................ 257/132, 133, 257/137, 146, 378

[56] References Cited

U.S. PATENT DOCUMENTS

| | | |
|---|---|---|
| 5,091,766 | 2/1992 | Terashima. |
| 5,444,272 | 8/1995 | Ajit ................................. 257/137 |
| 5,659,185 | 8/1997 | Iwamuro ........................... 257/138 |

*Primary Examiner*—Ngân V. Ngô
*Attorney, Agent, or Firm*—Ostrolenk, Faber, Gerb & Soffen, LLP

[57] ABSTRACT

A thyristor structure in which the DMOSFET connecting the $N^+$ emitter to the $N^-$ drift region is eliminated and instead replaced with a DMOSFET connecting the $N^+$ cathode to the $N-$ drift region providing the base drive for the PNP transistor of the thyristor structure. The thyristor structure of the present invention provides lower on-state voltage drop as compared to prior art EST structures.

7 Claims, 7 Drawing Sheets

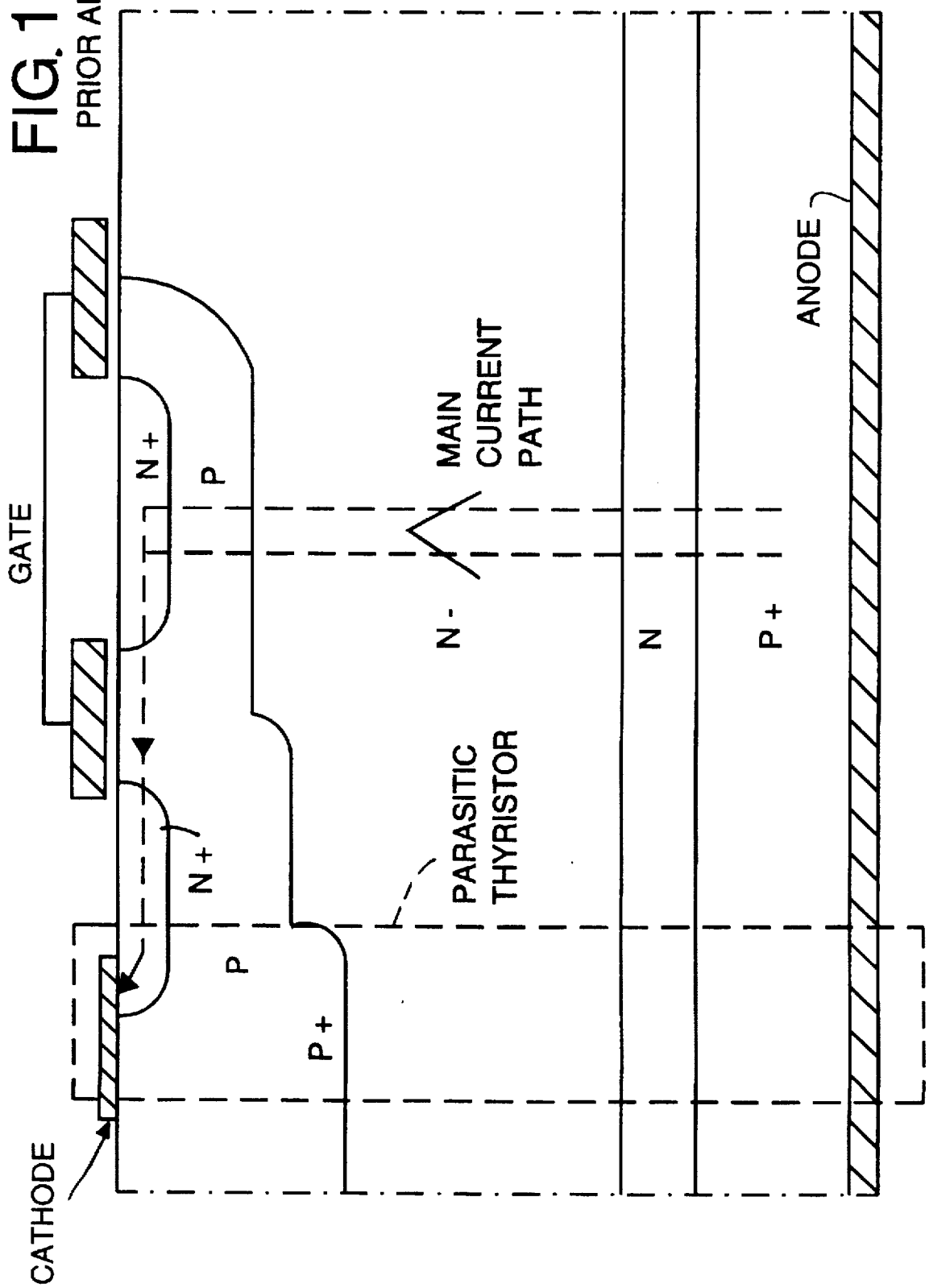

EMITTER SWITCHED THYRISTOR

This is a continuation-in-part of application Ser. No. 08/516,824, filed Aug. 18, 1995, which is a continuation-in-part of application Ser. No. 08/281,917, filed Jul. 28, 1994, now U.S. Pat. No. 5,444,272, the disclosure of which is herein incorporated by reference.

BACKGROUND OF THE INVENTION

1. Field of Invention

The present invention relates to a MOS-controlled thyristor and more particularly, to an emitter switched MOS-controlled thyristor with reduced on-state voltage drop.

2. Description of the Related Art

Power semiconductor structures that combine bipolar conducting mechanisms with a MOS control are well known. The insulated gate bipolar transistor (IGBT) is an example of such a device, in which the base current of a bipolar structure is controlled via an integrated MOSFET. The IGBT is best suited for high-voltage power electronic applications with blocking voltages in the range of 600 volts. IGBTs capable of handling higher voltages have a higher on-state voltage drop, which is disadvantageous. Since a lower on-state voltage drop is achievable by carrying the on-state current through a thyristor structure, MOS-gated thyristors have received considerable interest for high current, high voltage applications.

Two types of previously reported MOS-gated thyristors are: (1) the MOS-controlled thyristor (MCT)/base resistance controlled thyristor (BRT), and (2) the emitter switched thyristor (EST). In the MCT and BRT, as described in an article by V. A. K. Temple, *IEEE International Electron Device Meeting (IEDM) Technical Digest*, San Francisco (December 1984), pp. 282–85, a cathode short circuit is switched via a MOS gate. However, the MCT and BRT do not have any current limiting capability and hence no short-circuit capability. Also, although the maximum controllable current of single cell MCT and BRT devices is large, a significant reduction is observed in multi-cellular devices due to variation of turn-off channel resistance leading to current filamentation.

The EST, as shown in FIG. 1 and FIG. 1A, basically consists of a MOSFET in series with a thyristor, with the $N^+$ emitter of the thyristor structure being connected, via respective series lateral DMOSFETs, on one side to the cathode and, on the other side, to the $N^{31}$ drift region. Higher controllable currents and better Safe Operating Area (SOA) are obtained by leaving the $N^+$ emitter floating during on-state and turn-off in the EST (because the dependence of maximum turn-off current capability on the variation of channel resistance across the multicellular die is reduced). However, the floating of the $N^+$ emitter raises the potential of the $N^+$ emitter (to a potential in between that of the drift region and that of the cathode) which in turn reduces the junction voltage from the $N^+$ emitter to the P base and thus reduces the electron injection from the $N^+$ emitter, hence disadvantageously increasing the on-state voltage drop of the device.

Accordingly, a need exists for a MOS-gate controlled thyristor which has the advantages associated with the prior art emitter switched thyristor structures described above, but which has a lower on-state voltage drop.

SUMMARY OF THE INVENTION

The present invention overcomes the disadvantages of the prior EST structures noted above and achieves the foregoing objective by providing a MOS-gate controlled thyristor structure which advantageously has a low on-state voltage drop than the prior structures.

In the EST structure of the present invention, the DMOSFET connecting the $N^+$ emitter to the drift region is eliminated and is instead replaced with a DMOSFET connecting the $N^+$ cathode to the $N^{31}$ drift region.

More specifically, the structure of the present invention comprises a wafer of semiconductor material having first and second spaced, parallel planar surfaces. A relatively lightly doped N-type layer extends from the first semiconductor surface, while a P-type layer extends from the second semiconductor surface.

A P-type base is formed in the relatively lightly doped N-type layer and extends from the first semiconductor surface to a first depth beneath the first semiconductor surface. An $N^+$ emitter region is formed in the P-type base and extends from the first semiconductor surface to a second depth beneath the semiconductor surface which is shallower than the first depth to create an $N^+$ emitter/P-type base junction.

First and second spaced $N^+$ cathode regions are formed in the relatively lightly doped P-type base radially outwardly on sides of the $N^+$ emitter region, the first $N^+$ cathode regions being laterally spaced radially outwardly from said $N^+$ emitter region to form respective first channel regions, the second $N^+$ cathode regions being spaced radially outwardly from first $N^+$ cathode regions and radially inwardly from an edge of the P-type base to form respective second channel regions.

An insulated gate is disposed over the first and second channel regions, an anode electrode is connected to the P-type layer disposed on the second semiconductor surface, a cathode electrode is connected to the $N^+$ cathode regions and a gate electrode is connected to the insulated gate.

The device is preferably provided in a cellular topology.

In another embodiment of the invention, a $P^+$ diverter region is formed, the $P^+$ diverter region being separated from P base region by the relatively lightly doped N type layer.

Other features and advantages of the present invention will become apparent from the following description of the invention which refers to the accompanying drawings.

BRIEF DESCRIPTION OF THE DRAWINGS

FIG. 1 is a cross-sectional view of a typical prior art Emitter Switched Thyristor (EST).

DETAILED DESCRIPTION OF THE PREFERRED EMBODIMENT

Figure 1A:
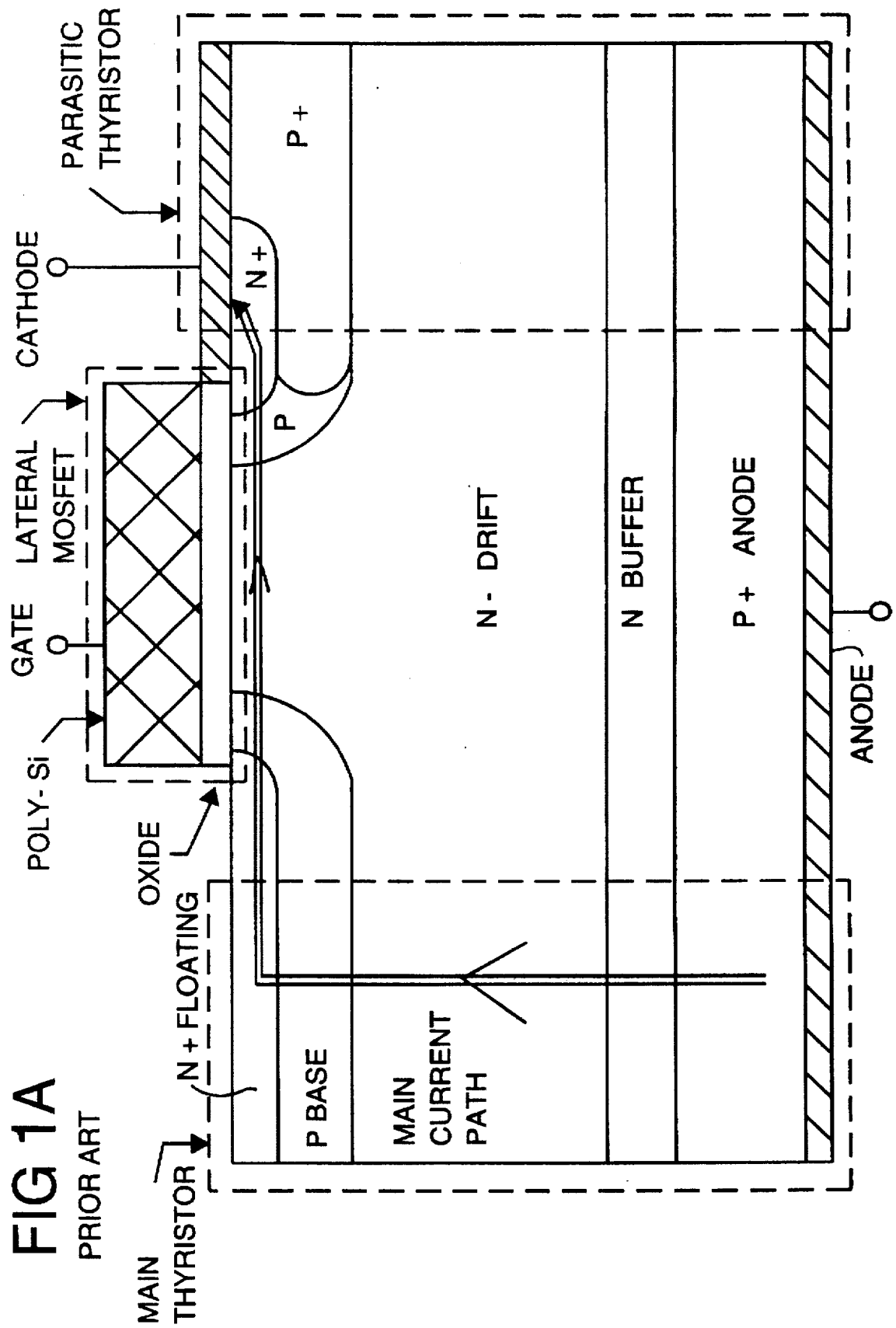
FIG. 1A is a cross-sectional view of a prior art EST designed for High Voltage Current Saturation.
Figure 1B:
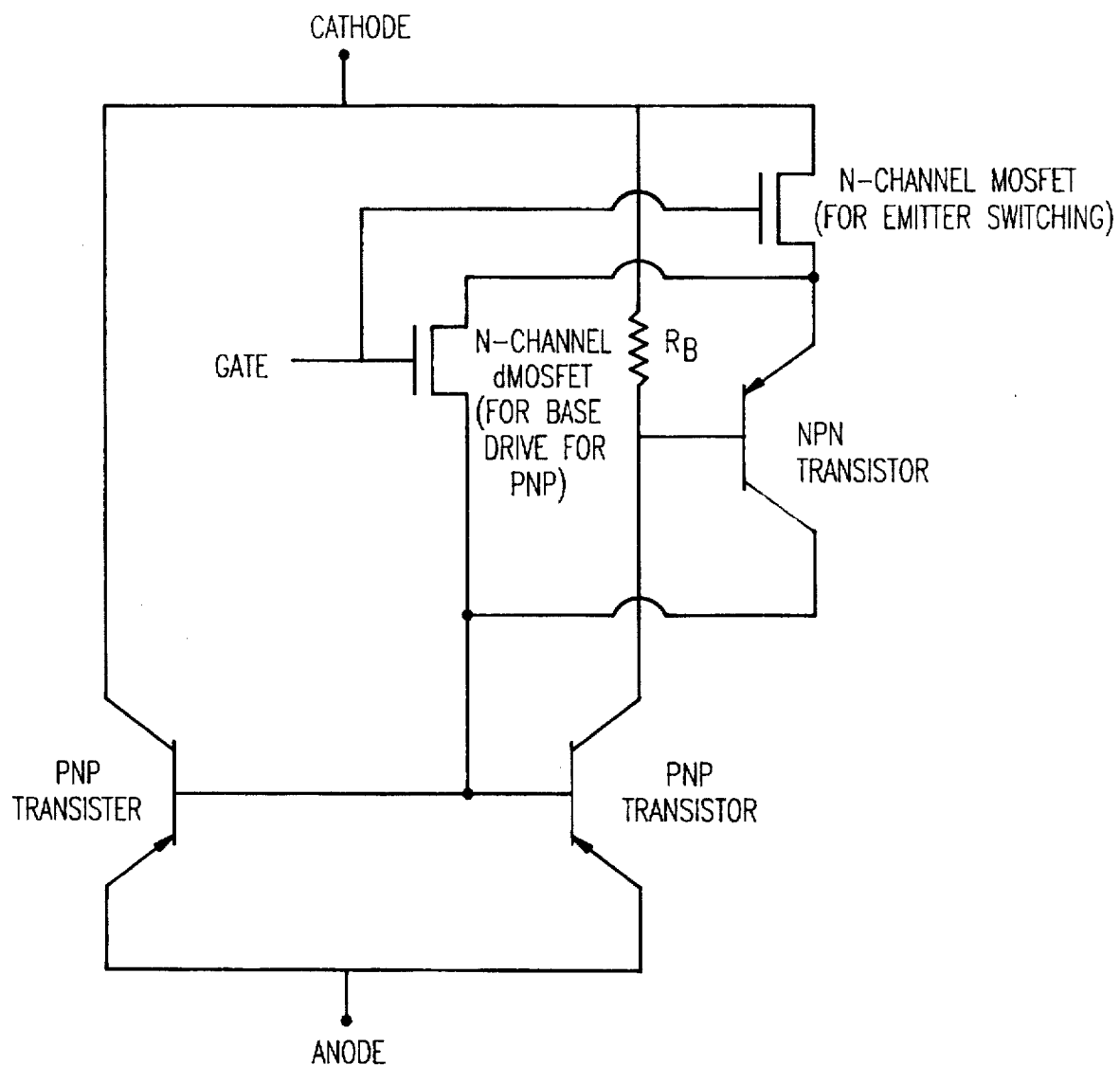
FIG. 1B shows the equivalent circuit of the prior art EST of FIG. 1.
Figure 2:
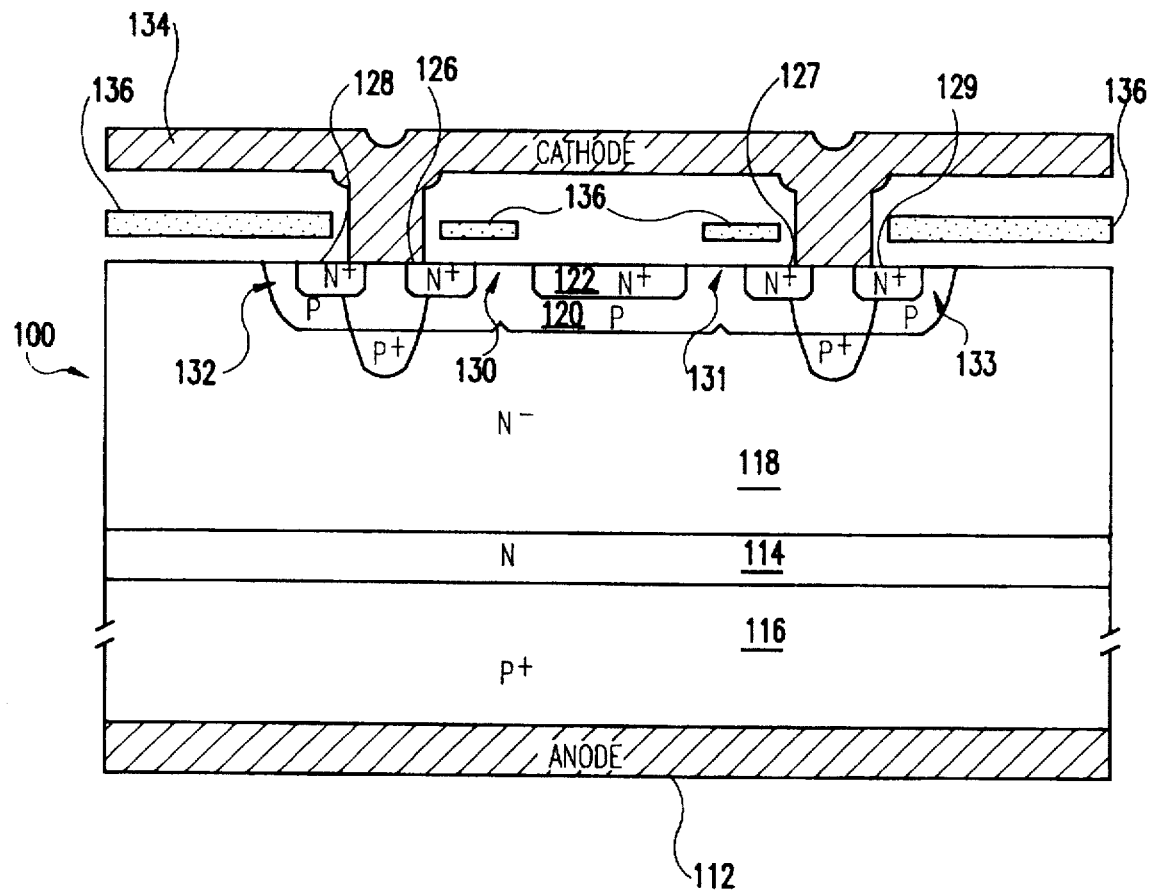
FIG. 2 is a cross-sectional view of a unit cell of the emitter switched thyristor of the present invention.

Referring to FIG. 2, a cross-sectional view of unit cell of the emitter switched MOS-controlled thyristor of the present invention is shown. MOS-controlled thyristor 100 is a vertical conduction device.

An N-type layer 114 and a highly doped P⁺ emitter region 116 are disposed on the underside of an N⁻ layer 118. For lower voltage applications (<1200 V), N⁻ layer 118 is preferably epitaxially grown on a N epi/P⁺ substrate. For higher voltage applications (>1200 V), N⁻ layer 118 is preferably the starting substrate material and N layer 114 and P⁺ region 116 are backside diffusions.

An anode electrode 112 on the bottom surface of the device covers P⁺ region 116. Anode electrode 112 is coupled to an anode terminal.

The layer thicknesses and concentrations depend on the device blocking voltage. For a 2,500 V device, the doping density and thickness of N⁻ drift region are in the range of $2 \times 10^{13}$ cm⁻³ and 500 µm, respectively. The doping density of P⁺ region 116 is preferably greater than $5 \times 10^{19}$ cm⁻³, with a thickness greater than 1 µm. The doping density of N layer 114 is preferably approximately $5 \times 10^{17}$ cm⁻³, with a thickness of approximately 7 µm.

Disposed within N⁻ layer 118 is a P-type base 120. An N⁺ emitter region 122 is disposed within P base 120. Two additional spaced N-type regions extend into the chip from the upper surface of the device on both sides of N⁺ emitter region 122, namely N⁺ cathode regions 126, 127 and N⁺ cathode regions 128, 129. N⁺ cathode regions 126, 127 are disposed radially inwardly from N⁺ cathode regions 128, 129 on each side of N⁺ emitter region 122 and are spaced from N⁺ emitter region 122 by respective relatively small regions of P base 120 which extend to the surface of the wafer to form respective first channel regions 130, 131. Similarly, the radially outer edges of N⁺ cathode regions 128, 129 are separated from N⁻ layer 118 by the outward edges of P base 120 which extend to the surface of the wafer to form respective second channel regions 132, 133.

The N⁺ cathode regions 126, 127, 128 and 129 are contacted directly by cathode electrode 134, which also contacts the portion of P base 120 therebetween. A gate electrode 136 overlies first channel regions 130, 131 and second channel regions 132, 133. Gate 136 is preferably comprised of polysilicon and is insulated from the upper surface of the device by a layer of oxide (not shown).

Figure 3:
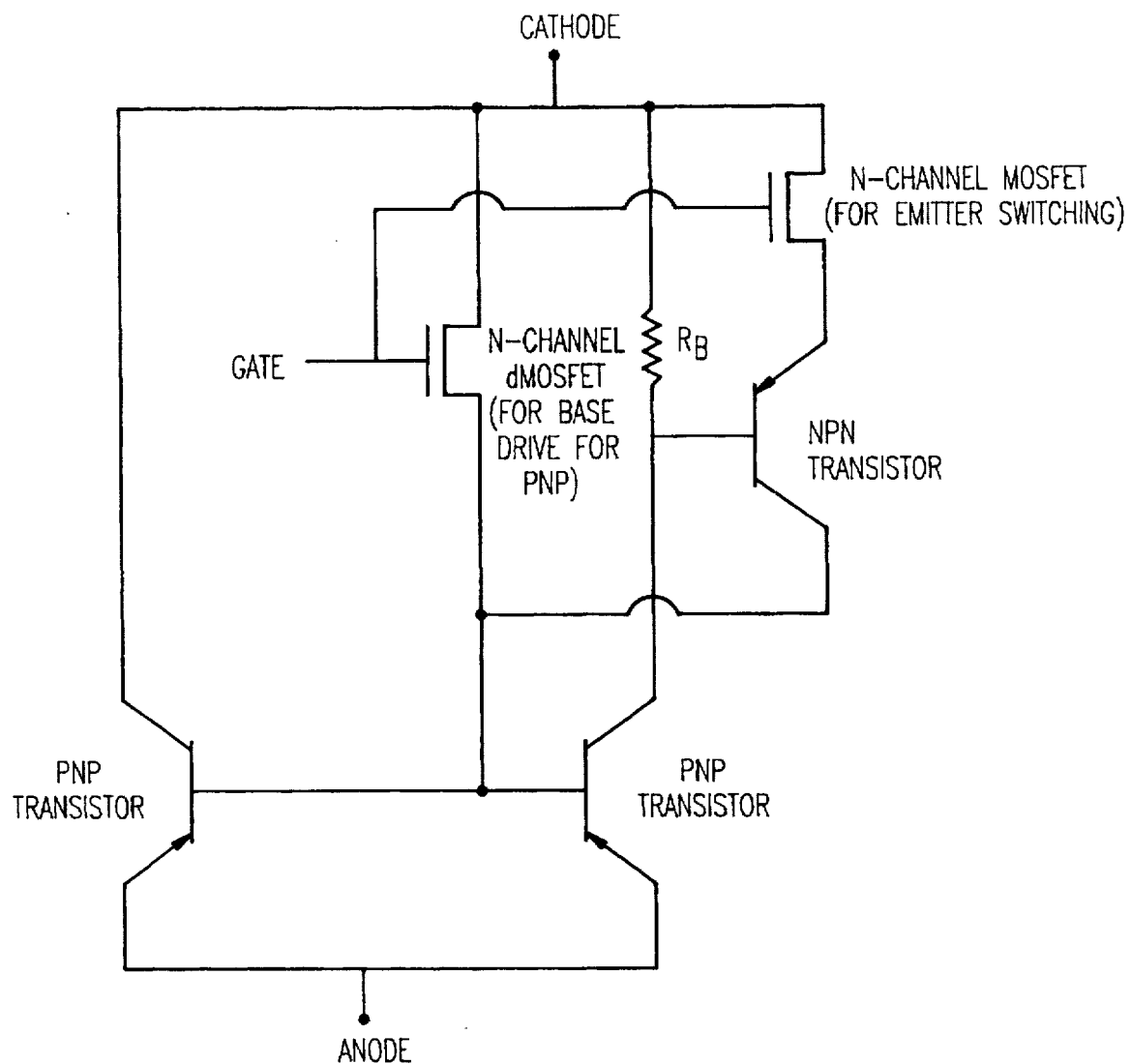
FIG. 3 is an equivalent circuit of the emitter switched thyristor of the present invention.

The equivalent circuit of the device of the present invention is shown in FIG. 3. In the on-state, with the anode at a positive potential with respect to the cathode and the voltage on gate electrode 136 sufficiently positive to turn-on first channels regions 130, 131 and second channel regions 132, 133, current flows upwardly through the device from anode to cathode. The electrical connection of N⁺ cathode regions 126 and 128 to the N⁻ drift layer 118 through second channel regions 132, 133 provides the base drive for the PNP transistor, causing the thyristor to go into the latched state. Current now flows through the main P⁺/N/N⁻/P/N⁺ thyristor structure, with the N⁺ emitter region 122 coupled to the cathode via first channel regions 130, 131.

Figure 4:
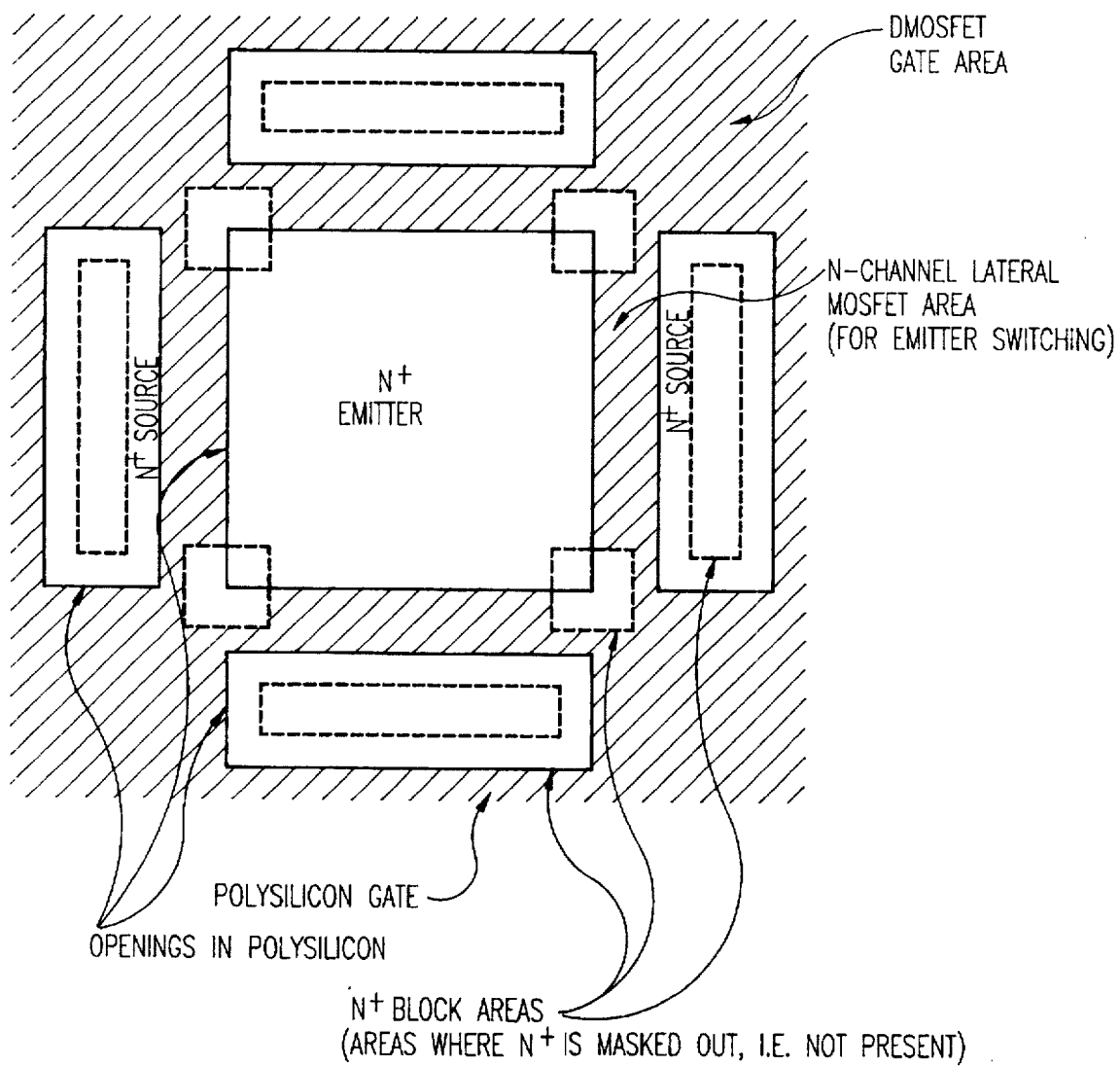
FIG. 4 shows the mask layout for the emitter switched thyristor of the present invention.
Figure 5:
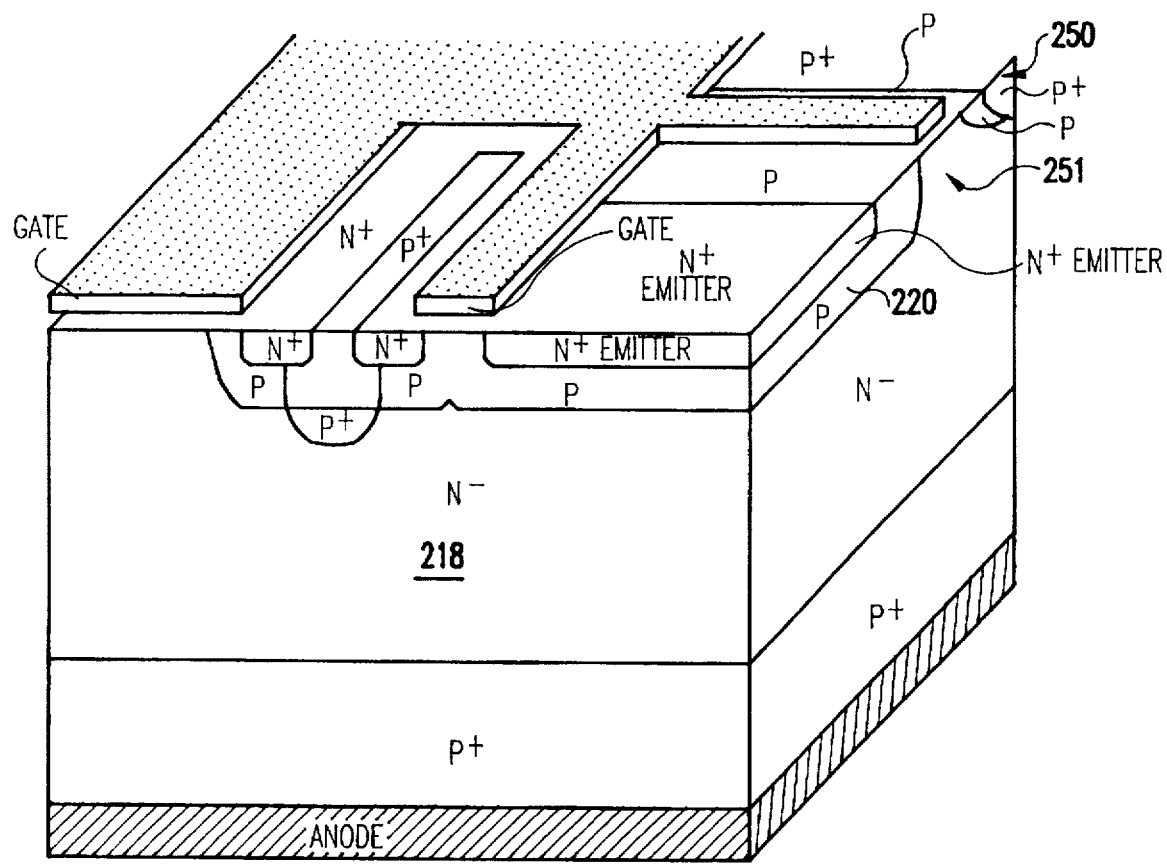
FIG. 5 shows a cross-sectional view of a second embodiment of the present invention.

The present invention advantageously has lower on-state voltage drop as compared to prior art EST structures. A preferred cellular implementation of the device of the present invention is shown in FIG. 4.

FIG. 2 shows a cross-sectional view of a second embodiment of the present invention. A P⁺ diverter region 250 is formed in the relatively lightly doped N⁻ type region 218 and separated from P base region 220 by a portion of the relatively lightly doped N⁻ type region 251. In the on-state operation of the device, when the potential of the P base region 220 exceeds a certain predetermined value, the P base region 220 punches-through to the P⁺ diverter region 250. This results in hole current being diverted from P base 220 to P+ diverter 250 and causing the thyristor to become unlatched. This leads to current saturation in the device at high voltages as explained in application Ser. No. 08/516, 824, filed Aug. 18, 1995, of which this application is a continuation-in-part.

Although the present invention has been described in relation to particular embodiments thereof, many other variations and modifications will become apparent to those skilled in the art. It is preferred, therefore, that the present invention be limited not by the specific disclosure herein, but only by the appended claims.

What is claimed is:

1. An emitter switched thyristor, comprising:
   a wafer of semiconductor material having first and second spaced, parallel planar surfaces, at least a portion of the thickness of the wafer which extends from said first semiconductor surface comprising a relatively lightly doped layer of a first conductivity type for receiving junctions, at least a portion of the thickness of said wafer which extends from said second semiconductor surface comprising a relatively highly doped layer of a second conductivity type;
   a first region of said second conductivity type comprising a base region formed in said relatively lightly doped layer of said first conductivity type and extending from said first semiconductor surface to a first depth beneath said first semiconductor surface;
   an emitter region of said first conductivity type formed in said base and extending from said first semiconductor surface to a second depth beneath said semiconductor surface which is shallower than said first depth to create an emitter/base junction;
   first and second spaced cathode regions of said first conductivity type formed in said base region, said first cathode regions being laterally spaced radially outwardly from said emitter region on sides of said emitter region to form respective first channel regions, said second cathode regions being spaced radially inwardly from respective lateral edges of said base region to form respective second channel regions;
   gate insulation layer means on said first semiconductor surface disposed at least on said first and second channel regions;
   gate means disposed over said gate insulation layer means and overlying said first and second channel regions;
   first electrode means connected to said layer of second conductivity type disposed on said second semiconductor surface;
   second electrode means connected to said first and second spaced cathode regions; and
   gate electrode means connected to said gate means.

2. The emitter switched thyristor of claim 1, wherein said thyristor is provided in a cellular topology.

3. The emitter switched thyristor of claim 1, wherein said emitter region is relatively highly doped.

4. The emitter switched thyristor of claim 1, wherein said cathode regions are relatively highly doped.

5. The emitter switched thyristor of claim 1, wherein said first conductivity type is N type, and wherein said second conductivity type is P type.

6. The emitter switched thyristor of claim 1, wherein a diverter region of said second conductivity type connected to said second electrode is formed in said relatively lightly doped layer of said first conductivity type and extends from said first semiconductor surface to a third depth beneath said first semiconductor surface, said diverter region being spaced from said base region by a portion of said relatively lightly doped layer of said first conductivity type.

7. The emitter switched thyristor of claim 1, wherein said base region is connected to said second electrode.

* * * * *